United States Patent [19]

Sakai et al.

[11] Patent Number: 5,079,226
[45] Date of Patent: Jan. 7, 1992

[54] SUPERCONDUCTOR JOINTED STRUCTURE

[75] Inventors: Hitoshi Sakai, Komaki; Hitoshi Yoshida, Okazaki, both of Japan

[73] Assignee: NGK Insulators, Ltd., Aichi, Japan

[21] Appl. No.: 501,818

[22] Filed: Mar. 28, 1990

[30] Foreign Application Priority Data

Mar. 30, 1989 [JP] Japan .................... 1-79519
May 15, 1989 [JP] Japan .................... 1-120687
Mar. 5, 1990 [JP] Japan .................... 2-53390

[51] Int. Cl.$^5$ .......... H01L 39/22; B05D 5/12; H01B 12/00; B22C 00/00
[52] U.S. Cl. .......... 505/1; 357/5; 427/62; 427/63; 505/733; 505/822
[58] Field of Search .......... 427/62; 307/91; 285/329; 505/733

[56] References Cited

U.S. PATENT DOCUMENTS 4,336,958 6/1982 Goetzinger .................... 285/329
4,861,751 8/1989 Tenhover .................... 427/62

FOREIGN PATENT DOCUMENTS 0371462 6/1990 European Pat. Off.
0128206 1/1989 Japan.

OTHER PUBLICATIONS

"Y—Ba—Cu—O/Tb Tunnel Type Josephson Junction", Inoue et al., Japanese J. Appl. Phys., vol. 26, #9, Sep. 1987, pp. L1443-L1444.

"Effects of Silver and Gold on the Y Ba Cuo Superconducting Thin Films with the Use of AG/Cu/BaO/Y$_2$O$_3$, . . . Structures", Chang, App. Phys, Lett., vol. 52, #11, Mar. 14, 1988, pp. 924-926.

"A Transmission Electron Microscope and Group Theoretical Study of the New Bi-Based High-Tc Superconductors, and some closely related Aurivillius Phases", Withers et al., J. Phys. C.:Solid State Phys., vol. 21, 1988 (Dec.), pp. 6067-6083.

"Bulk Bi Pb Sr CaCuO rt Squids Operating up to 101 K", Zhang et al., App. Phys. Lett., vol. 56, #16, Apr. 16, 1990, pp. 1579-1581.

IEEE Transactions on Magnetics, vol. 25, No. 2, Mar. 1989, pp. 2534-2537.

Physical Review, vol. 148, No. 1, Aug. 5, 1966, pp. 280-286.

Japanese Journal of Applied Physics, vol. 28, No. 10, Oct. 1989, pp. L1740-L1741.

*Primary Examiner*—Rolf Hille
*Assistant Examiner*—Mahshid Saadat
*Attorney, Agent, or Firm*—Armstrong, Nikaido, Marmelstein, Kubovcik & Murray

[57] ABSTRACT

A jointed structure comprising at least two kinds of oxide superconductor having different melting points, higher melting point superconductor and one lower melting point oxide superconductor being alternately jointed. In this jointed structure, the lower melting oxide superconductor is used as a joint layer for the higher melting oxide superconductors. The jointed structure can be obtained by combining an Y—Ba—Cu—O oxide superconducting material and a Bi—Sr—Ca—Cu—O oxide superconducting material, or by combining two Bi—Sr—Ca—Cu—O oxide superconducting materials of different compositions and accordingly of different melting points. Large cylindrical structures used as, for example, a container for apparatus for biomagnetism measurement can be produced by jointing two or more divided cylindrical parts. In this case, the techique of the jointed structure of the present invention can be applied for jointing of the divided cylindrical parts. The cylindrical structure produced by jointing divided cylindrical parts according to the present invention can prevent the incoming of geomagnetism, thereby enabling reliable measurement of biomagnetism.

13 Claims, 3 Drawing Sheets (A)

(B)

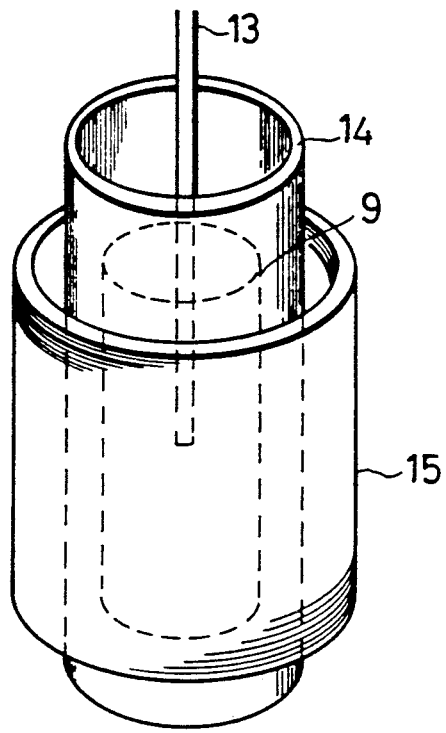
FIG.3
FIG.5
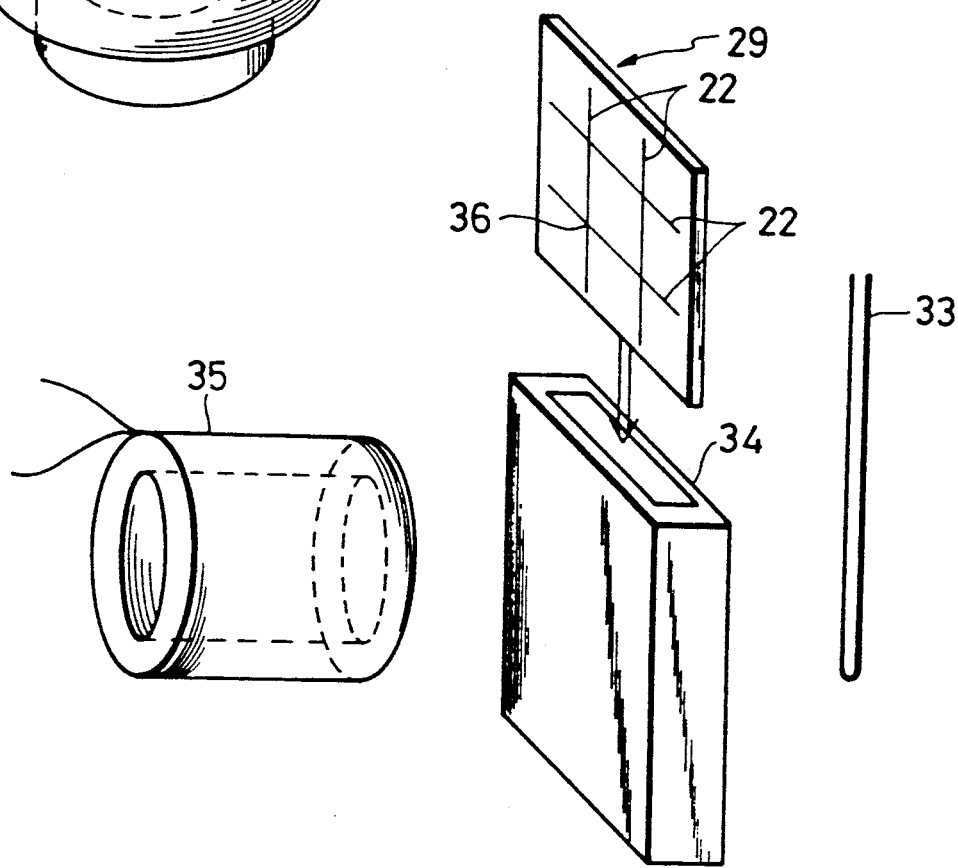

(A)

(B)

SUPERCONDUCTOR JOINTED STRUCTURE

BACKGROUND OF THE INVENTION AND RELATED ART STATEMENT

The present invention relates to a jointed structure comprising at least two kinds of oxide superconductor having different melting points.

In recent years, oxide superconducting materials have drawn attention for their high critical temperatures, and their applications in such fields as electric power, NMR apparatus, magnetic shielding and the like are expected.

Measurement of very weak biomagnetism has become possible by using an oxide superconducting material and a simple cooling apparatus utilizing liquid nitrogen. Accordingly, further application of oxide superconducting material is expected in medical science and medical care, in particular.

In measurement of biomagnetism, the apparatus used therefor must be able to not only contain a living body but also form a space of very low magnetic field. As the container for living body, cylindrical structures have been proposed generally. In order for a cylindrical structure to form a space of very low magnetic field, it is necessary that a supercurrent strong enough to shield geomagnetism flow uniformly throughout the all parts of the cylinder. Accordingly, it has hitherto been thought that the cylinder for containing a living body must be produced in one piece. In production of oxide superconductor structures of large to small sizes, however, it is difficult to effect molding and firing always in one piece.

A cylinder used as a container for measurement of biomagnetism must have a minimum diameter of about 1 m and a length of about 3 m when the cylinder is used for, for example, a living body.

In producing such a large cylinder in one piece, a large electric furnace is required (this is not practical) and moreover it is thought to be extremely difficult with the present technique to obtain an oxide superconductor cylinder having uniform properties throughout the cylinder.

Hence, it becomes necessary in production of various oxide superconductor structures to prepare divided parts and then joint these parts.

Currently, in jointing oxide superconductor parts, it is known to use, as a jointing layer, an oxide superconducting material having the same composition as the oxide superconductor parts to be jointed. It is also known to add a small amount of a non-superconducting material to said superconducting material in order to improve the adhesion between the jointing layer and the oxide superconductor parts to be jointed.

SUMMARY OF THE INVENTION

The above conventional jointing method of using, as a jointing layer, an oxide superconducting material having the same composition as the oxide superconductor parts to be jointed includes jointing by melting and jointing by sintering. In the jointing by melting, the oxide superconductor parts to be jointed cause deformation, thereby reducing their superconducting properties. In the jointing by sintering, the joint strength is weak and insufficient in practical application. Meanwhile in the jointing method wherein a non-superconducting material is added, the resulting joint layer has significantly reduced superconducting properties and is not practical.

The present invention is intended to provide, in jointing oxide superconductor parts to obtain an oxide superconductor jointed structure, a joint layer which gives a strong joint strength and which causes no reduction in superconducting properties.

The present invention is also intended to provide a container for biomagnetism measurement which is applicable in industry. It has conventionally been thought that only containers of uniform oxide superconductor produced by one-piece molding, etc. can shield geomagnetism to form a space of very low magnetic field; however the present invention is intended to prepare divided oxide superconductor cylinder parts and then joint these parts to produce a long oxide superconductor cylinder jointed.

The present invention is further intended to specify, in obtaining a jointed cylinder of high magnetic shieldability, the site(s) for division and the condition of jointing.

According to the present invention there is provided a jointed structure made of at least two oxide superconducting materials of different melting points, which consists of two or more high melting oxide superconducting material parts and at least one low melting oxide superconducting material part and which is constituted in such a way that each one such low melting oxide superconducting material part is interposed between each two such high melting oxide superconducting material parts.

In the present invention, at least two kinds of oxide superconducting materials of different melting points are used in combination; that is, higher melting point oxide superconducting materials are jointed by a joint layer which is a lower melting point oxide superconducting material; the resulting oxide superconductor jointed structure has a large adhesion strength and maintains the superconducting properties of the higher melting point oxide superconducting material parts.

The jointed structure comprising at least two kinds of oxide superconducting materials of different melting points according to the present invention is suitably used in production of various oxide superconductor structures.

The present invention provides, in particular, a large oxide superconductor cylinder obtained by firstly preparing divided parts of the cylinder and then making these parts into one piece using the above-mentioned joint layer. This oxide superconductor cylinder having a jointed layer, although not produced by one-piece molding, can shield geomagnetism.

It has hitherto been thought that only the cylinder produced by one-piece molding can shield geomagnetism, but industrial production of such a large cylinder used for biomagnetism measurement has been difficult. Therefore, the large oxide superconductor cylinder according to the present invention is very useful.

BRIEF DESCRIPTION OF THE DRAWINGS

FIG. 3 is a schematic illustration of a cylindrical apparatus for measurement of magnetic field shieldability.

FIG. 5 is a schematic illustraion of a panel-shaped apparatus for measurement of magnetic field shieldability.

DETAILED DESCRIPTION OF THE INVENTION

Figure 1:
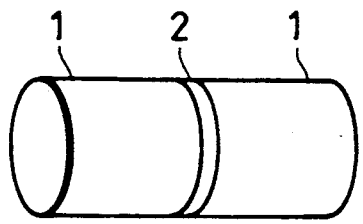
FIG. 1 is a schematic illustration of one embodiment of the jointed structure of the present invention.

As the oxide superconducting materials of the present invention, there are used, for example, M—Ba—Cu—O type compounds [M is at least one element selected from Sc, Tl, Y and lanthanide elements (e.g. La, Eu, Gd, Er, Yb, Lu)] and Bi—Sr—Ca—Cu—O type compounds, all having a multilayered perovskite structure.

In the present invention, oxide superconducting materials of different melting points are used in combination. A difference of melting point temperature between the higher melting point oxide superconductor and the lower melting point oxide superconductor is from 5° C. to 200° C., preferably from 10° C. to 100° C. When the temperature difference is less than 5° C., the higher melting point superconductor remelts when fired, resulting in deterioration of superconducting properties. When the temperature difference is more than 200° C., it is not possible to obtain the sufficient superconducting properties in the form of the usual superconducting material powder because the firing needs to be done at 800° C. or less. In that case, the oxide superconducting material of lower melting point preferably has, even after melting, a high critical current density owing to crystallization. Preferably, an M—Ba—Cu—O type compound and a Bi—Sr—Ca—Cu—O type compound are used in combination. M—Ba—Cu—O type compounds wherein M is a lanthanide metal, such as $YBa_2Cu_3O_7$, $LaBa_2Cu_3O_7$ and the like have a melting point of 960° C. or more in the atmosphere and a sintering temperature of 920°-960° C. Meanwhile, Bi—Sr—Ca—Cu—O type compounds such as $Bi_2Sr_2CaCu_2O_x$, $Bi_2Sr_2Ca_2Cu_3O_x$ and the like, as well as compounds obtained by incorporating Pb and/or Sb into a Bi—Sr—Ca—Cu—O type compound, begins partial melting at 860°-920° C. in the atmosphere although the temperature differs slightly depending upon their compositions. It is well known that Bi—Sr—Ca—Cu—O type compounds show superconducting properties owing to the crystallization after melting. Accordingly, when a Bi—Sr—Ca—Cu—O type compound is used as a joint layer for parts of M—Ba—Cu—type compound (e.g. $YBa_2Cu_3O_7$), the molten jointing by the Bi—Sr—Ca—Cu—O type compound can be conducted at temperatures of 920° C. or less, and the parts can be jointed with no creep to obtain a jointed structure comprising parts of M—Ba—Cu—O type oxide superconducting material and a joint layer of Bi—Sr—Ca—Cu—O type oxide superconducting material interposed between the parts.

Bi—Sr—Ca—Cu—O type compounds can give various superconducting phases by taking different compositions or containing various additives, and have different melting points in the range of 860°-920° C. Accordingly, by using at least two different superconducting phases each of Bi—Sr—Ca—Cu—O type compound, there can be obtained another jointed structure comprising parts of higher melting point Bi—Sr—Ca—Cu—O type superconductor and a joint layer of lower melting point Bi—Sr—Ca—Cu—O type oxide superconductor interposed between the parts.

In one example of using two Bi—Sr—Ca—Cu—O type compounds of different compositions to obtain a jointed structure, when the Bi content in the composition of a Bi—Sr—Ca—Cu—O type oxide superconducting material to be used as a high melting superconducting material is increased, the resulting oxide superconducting material has a lower melting point and can be used as a low melting oxide superconducting material. For example, when $Bi_2Sr_2Ca_2Cu_3O_x$ of stoichiometric composition is used as a high melting oxide superconducting material, there can be used, as a low melting oxide superconducting material, $Bi_2Sr_2Ca_1Cu_2O_x$ of stoichiometric composition, $Bi_{2.5}Sr_2Ca_2Cu_3O_x$ of non-stoichiometric composition, or the like.

Also when a noble metal (e.g. Au, Ag) or Pb is added to a Bi—Sr—Ca—Cu—O type compound of stoichiometric composition, the resulting composition has a lower melting point without reducing the superconducting properties of the former compound. Thus, a Bi—Sr—Ca—Cu—O type compound of stoichiometric composition can be used as a high melting oxide superconducting material, and a composition obtained by adding a noble metal or Pb to the above compound can be used as a low melting oxide superconducting material. The addition amount of noble metal or Pb is 0.1% by weight or more, preferably 1-20% by weight. When the amount is less than 0.1% by weight, no effect of melting point reduction is observed. When the amount is more than 20% by weight, there occurs deterioration of superconducting properties.

The jointed structure of the present invention can consist of two or more higher melting point oxide superconductors and at least one lower melting point oxide superconductor, each made of one of the above mentioned oxide compounds, or can take such a form that both the higher melting point oxide superconductor and the lower melting point oxide superconductor are formed on a substrate made of a metal, a ceramic or the like. When a metal substrate is used, it is preferable that the metal substrate surface be subjected to a pretreatment as necessary, depending upon the type of metal, the type of superconducting material, etc. For example, when Bi—Sr—Ca—Cu—O type compounds are used as oxide superconducting materials, it is preferable that a nonreactive intermediate layer of ceramic, noble metal or the like be formed on the substrate in advance because said compounds have high reactivity with the substrate metal.

In the present invention, the jointing of higher melting point oxide superconductors and a lower melting point oxide superconductor can be effected, for example, by making a lower melting oxide superconducting material powder into a slurry using an appropriate solvent, coating the slurry on the joint area of each higher melting point oxide superconductor to be jointed. jointing each two of these joint areas, and heating each new joint area to the melting point of the low melting oxide superconducting material or more to melt the low melting oxide superconducting material. The jointing may also be effected by preparing a molded article of a low melting oxide superconducting material to later become a joint layer, jointing one end of this molded article with one high melting superconducting material part at the melting point of the molded article, and jointing the other end of the molded article with another high melting oxide superconducting material part at the same melting point. The jointing may also be effected by placing a molded article of low melting oxide superconducting material between two high melting oxide superconducting material parts to be jointed and heating the molded article to its melting point to joint the two parts. The heating for effecting jointing is not restricted particularly and can be achieved by various methods as long as it can allow the joint area to reach the melting point of the low melting oxide superconducting material. For example, the heating can be effected by placing the structure consisting of the higher melting point oxide superconductors to be jointed and the lower melting point oxide superconductor in an electric furnace, or by applying a laser beam local to the joint area.

In jointing higher melting point oxide superconductors each formed on a substrate of metal or the like, using a low melting oxide superconducting material, it is preferable that, prior to the jointing, each two adjacent substrates be connected by fastening the flanges of the substrates with bolts and nuts, or by welding.

In the present invention, the thickness of the joint layer can be determined appropriately depending upon the application purpose of the jointed structure. When the jointed structure is used for the purpose of, for example, magnetic shielding, the thickness of the joint layer is preferably 2 mm or less usually.

The jointed structure of the present invention has a high strength. The reason is presumed to be that the low melting oxide superconducting material causes partial melting and enters into the surface pores or cracks of the higher melting point oxide superconductors to be jointed and as a result high adhesion is obtained. Another reason for high strength is that the jointed structure of the present invention comprises oxide superconductors having a multilayered perovskite structure and their thermal expansion coefficient is in a range of about $10 \times 10^{-6}$/°C. to about $15 \times 10^{-6}$/°C.

When the jointed structure of the present invention is used as a structure for magnetic shielding having a hollow portion so as to give rise to magnetic shielding therein, it is preferable that the structure be constructed so as to include joint layer(s) in a direction crossing the axis of the structure because the magnetic flux of external magnetic field comes into the hollow portion from the both ends of the structure. For example, in producing a jointed cylindrical structure, at least two cylindrical parts of shorter than 1 m obtained by dividing the structure in a direction crossing the axis of the structure are prepared, each one joint layer is placed between each two of the divided parts, and jointing of the parts is effected by melting the joint layer. The length of the jointed cylindrical structure is not restricted particularly but is generally 1 m or more.

The division of the cylindrical structure in a direction crossing the axis can be made preferably at an approximately right angle (90° C.) to the axis, but can be made at 90°±10° to the axis. When the division is made at an angle more than 90°±10°, no sufficient magnetic shielding is obtained and, when the resulting cylindrical structure is used as a container for biomagnetism measurement, it is impossible to obtain a space of very low magnetic field.

It is preferable that each of the joint layers be provided between each two divided cylindrical parts at intervals of 1/10 or more of the diameter of the cylinder. Accordingly, the divided cylindrical parts used in the present invention each have the same diameter (usually about 1 m) as the jointed cylinder and a length of 0.1–1.0 m. When the length of each divided part is less than 0.1 m, the joint layers having a lower critical current density exist at intervals of less than 0.1 m, and the resulting jointed cylinder has a low shielding effect for magnetic field and is not suitable for use as a container for biomagnetism measurement. When the length of each divided part is more than 1.0 m, such a part is not practical. Divided parts of, for example, 1 m in diameter and 1 m or less in length can be fired in an conventional electric furnace, and divided parts of 0.5 m or less in length can be fired in a conventional electric furnace of smaller size, whereby an oxide superconductor jointed cylinder which is uniform throughout the entire portion can be produced easily.

In the above cylindrical structure wherein magnetic shielding takes place in the hollow portion, the effect of magnetic shielding is not impaired even if the joint layers have lower superconducting properties than the divided cylindrical parts. Therefore, the critical current density (Jc) in the joint layers may be lower than the Jc of the divided cylindrical parts. In general, the Jc in the joint layers differs by the thickness of the oxide superconductor constituting the cylinder, or by the thickness of the oxide superconductor layer having superconducting properties when the cylinder takes a form of an oxide superconducting layer formed on a substrate of metal or the like. It has been made clear in the present invention that when the thickness of oxide superconducting material of cylinder is, for example, 1 mm, the jointed cylinder can exhibit magnetic shielding sufficiently if the joint layers are made of an oxide superconducting material having a Jc of 4 A/cm$^2$ or more and have a width of 0.5 mm or less.

In order to shield geomagnetism completely, it is generally necessary to reduce an external magnetic field by at about 5 G in view of the fluctuation of geomagnetism and the safety factor of shielding. Therefore, in the case of, for example, a cylindrical structure of 1 m in diameter and 3 m in length, it is necessary that the cylindrical structure have a diamagnetic current of about 4 A per 1 cm of the cylinder in the axial direction, i.e. a supercurrent at the outer surface of the cylinder. To satisfy this requirement, it has been thought that when the oxide superconductor constituting the cylinder has a thickness of, for example, 1 mm, the oxide superconducting material must have a Jc of 40 A/cm$^2$ and, when the oxide superconducting material has a thickness of 100 μm, the material must have a Jc of 400 A/cm$^2$. It has also been thought that when a cylindrical structure is produced by jointing divided parts from technical reasons, an external magnetic field possibly comes into the structure through the joint areas, making it impossible to reduce the external magnetic field.

Meanwhile, the present inventors studied on the amount of the external magnetic field (geomagnetism) coming into a jointed cylindrical structure having joint layer(s) in the direction crossing the cylindrical axis. According to the study, when the jointed cylindrical structure was, for example, an oxide superconductor cylinder of 1 m in diameter, 3 m in length and 1 mm in thickness, which consisted of two divided parts of equal size and one joint layer of 0.5 mm in width placed between the two divided parts substantially perpendicularly to the cylindrical axis, the amount of the geomagnetism which came into the jointed cylinder was about 10%. Therefore, as mentioned above, when the oxide superconductor constituting a jointed cylinder has a thickness of 1 mm, it is sufficient if the joint layer having a width of 0.5 mm has a Jc of 4 A/cm² or more.

In the present invention, the jointing of divided cylindrical parts can be effected by various methods such as (1) a method wherein a thin cylindrical oxide superconductor of lower melting point to later become a joint layer is placed between divided superconductor cylindrical parts of higher melting point and subjected to local melting to effect jointing, or a slurry of a lower melting oxide superconducting material is coated on the end surfaces of divided superconductor cylindrical parts of higher melting point and each two of these coated end surfaces are contacted with each other and subjected to partial firing to effect jointing, (2) a method wherein each two divided superconductor cylindrical parts are contacted with each other and subjected to local melting to effect jointing, and (3) a method wherein each two divided superconductor cylindrical parts are coated at the end surfaces with a slurry of the same oxide superconducting material as that constituting the divided cylindrical parts and each two of these coated end surfaces are contacted with each other and subjected to partial firing to effect jointing.

The partial melting or firing in the above jointing methods can be effected by, for example, the application of a laser beam or the use of a furnace for local firing.

EXAMPLES

The present invention is described in more detail by way of Examples. However, the present invention is in no way restricted to the Examples.

EXAMPLE 1

A $YBa_2Cu_3O_7$ powder was subjected to in-mold pressing to obtain pellets. The pellets were fired at 950° C. for 3 hours in oxygen to obtain Y-based columnar sintered articles having a diameter of 20 mm and a height of 10 mm.

A $Bi_2Sr_2CaCu_2O_8$ powder was subjected to in-mold pressing to obtain a Bi-based columnar molded article having a diameter of 20 mm and a height of 1.5 mm. This molded article was interposed between the Y-based sintered articles, as shown in FIG. 1, and they were subjected to press bonding. In FIG. 1, the numeral 1 refers to Y-based sintered articles and the numeral 2 refers to a Bi-based molded article.

The press-bonded article was heated at 900° C. for 30 minutes in oxygen to partially melt the joint layer, and the partially melted area was crystallized at 860° C. in oxygen to allow the area to have superconducting properties.

Thereafter, a metal jig was fixed to each one end of the press-bonded article with an adhesive, and the article was measured for adhesion strength by a tensile strength tester. The tensile strength was 60–80 MPa which was about 80% of the tensile strength (70–100 MPa) of the Y-based sintered articles. When there was repeated the same procedure as above except that there was used, as the joint layer, the above Y-based molded article, the adhesion strength was 20–30 MPa.

A rod-shaped sample of 2 mm × 2 mm × 20 mm was cut out from the above press-bonded article whose joint layer had been subjected to partial melting and subsequent crystallization, so that the joint layer was at the center of the rod-shaped sample. The rod-shaped sample was measured for critical current density (Jc) at the boiling point (77K.) of liquid nitrogen, by a four-probe method. The sample had a Jc of 100–200 A/cm² which was about the same as the Jc of the Y-based sintered articles.

EXAMPLE 2

The outer surface of an Inconel 625-made cylinder having a diameter of 100 mm, a length of 120 mm and a thickness of 2 mm was subjected to Ag plating at a thickness of 100 μm. On the resulting Ag layer a slurry obtained by dissolving a $Bi_2Sr_2CaCu_2O_x$ powder (average diameter=2 μm) in a solvent (isopropyl alcohol) was spray-coated, at a thickness of 500 μm. The resulting cylindrical article was subjected to partial melting at 890° C. for 15 minutes then cooled at a rate of 1° C./min, and crystallized at 850° C. for 15 hours in an oxygen atmosphere in an electric furnace. The resulting cylindrical sintered article was annealed in the electric furnace; then, the furnace inside was purged with nitrogen; the article was heat-treated at 400° C. for 10 hours. As a result, the Bi-based superconducting layer formed on the cylindrical substrate had a thickness of 300 μm. According to the above process, there were prepared four cylindrical sintered articles each having a Bi-based superconducting layer.

Figure 2:
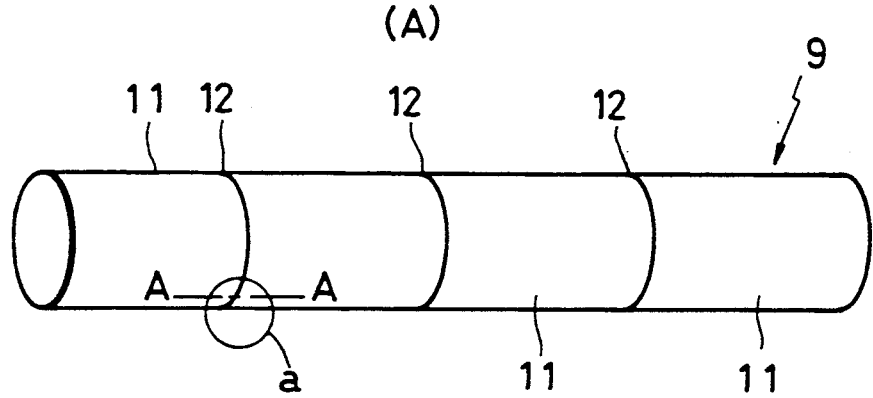
FIG. 2 (A) is a schematic illustration of a jointed cylinder which is other embodiment of the present invention, and FIG. 2 (B) is a sectional view taken at a A—A line, of the joint area of the jointed cylinder of FIG. 2 (A).
Figure 2:
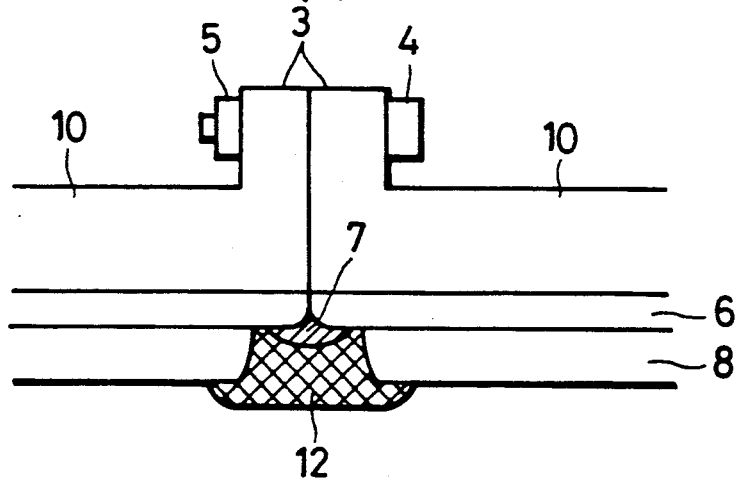

Next, as shown in FIG. 2(A), the four cylindrical sintered articles 11 were jointed at the end surfaces to prepare a jointed cylinder 9.

FIG. 2(B) shows a sectional view taken at an A—A line, of the portion a of the joint area 12 of the jointed cylinder 9 of FIG. 2(A). The Inconel-made cylindrical substrates 10 had flanges 3 at the ends inside the cylinder and each two these flanges were fixed to each other at the four points with bolts 4 and nuts 5. The joint areas of the plated Ag layers 6 were coated with an Ag paste 7. The joint areas of the Bi-based superconducting layers 8 were coated with a slurry obtained by dissolving a mixture of (a) the same $Bi_2Sr_2CaCu_2O_x$ powder as used in the formation of the Bi-based superconducting layers 8 and (b) 3% by weight of PbO, in isopropyl alcohol. The resulting jointed cylinder having a length of 480 mm was subjected to firing at 870° C. for 30 minutes, then the furnace temperature was lowered and crystallization was effected at 850° C. for 15 hours in an oxygen atmosphere in an electric furnace. The cylinder was then annealed and heat-treated at 400° C. for 10 hours in a nitrogen atmosphere. The superconductor joint layer had a thickness of 600 μm.

In the above firing at 870° C. for 30 minutes in an oxygen atmosphere, the Bi-based superconducting layers 8 were not melted and only the portions coated with the PbO-containing $Bi_2Sr_2CaCu_2O_x$ slurry were partially melted to form joint areas 12. Simultaneously, the Ag paste 7 was solidified by the firing to bond the Ag layers 6.

As a result, there was obtained a jointed cylinder 9.

This jointed cylinder 9 having a diameter of 100 mm and a length of 480 mm was measured for magnetic shieldability using a cylindrical apparatus for measurement of magnetic shieldability, schematically illustrated in FIG. 3. In FIG. 3, the jointed cylinder 9 was placed inside a container 14 for liquid nitrogen; the container 14 was filled with liquid nitrogen; and an external magnetic field was applied to the jointed cylinder 9 by an electromagnet 15; using a Gauss meter 13 placed inside the jointed cylinder 9, there was measured a maximum external magnetic field (this is the magnetic shieldability of the jointed cylinder 9) at which the magnetic field inside the jointed cylinder 9 began to exceed the background. As a result, the magnetic shieldability was 12 G.

After this measurement, the joint areas of the jointed cylinder 9 caused neither peeling nor cracking.

EXAMPLE 3

A SUS 310 stainless steel-made cylinder having a diameter of 100 mm, a length of 120 mm and a thickness of 2 mm was coated, at the outer surface, with a slurry containing a glass frit for porcelain enamel, at a thickness of 100 μm. Thereonto was press-bonded an Ag foil having a thickness of 100 μm. The resulting cylinder was fired at 900° C. for 1 hour in the atmosphere. Using the fired cylinder as a substrate, there was repeated the same procedure (molding and firing) as in Example 2, to prepare four cylindrical sintered articles each having a Bi-based superconducting layer.

The four cylindrical sintered articles were jointed in the same procedure as in Example 2. In jointing, the Ag foil layers were jointed by coating an Ag paste at the joint areas; the Bi-based superconducting layers were jointed by coating, at the joint areas, a slurry obtained by dissolving a $Bi_2Sr_2CaCu_2O_x$ powder and 5% by weight of $Ag_2O$ in isopropylalcohol; then, the same procedure as in Example 2 was applied to obtain a jointed cylinder.

The jointed cylinder was measured for magnetic shieldability in the same manner as in Example 2. The magnetic shieldability was 10 G. After the measurement, the joint areas of the cylinder caused neither peeling nor cracking.

EXAMPLE 4

An inconel 825-made flat substrate of 333 mm × 333 mm × 1 mm was subjected at one side to Ag plating at a thickness of 100 μm. On the Ag layer was formed a Bi-based superconducting layer by the same coating and firing procedure as in Example 2, to prepare nine flat sintered articles having a Bi-based superconducting layer at a thickness of 300 μm.

Figure 4:
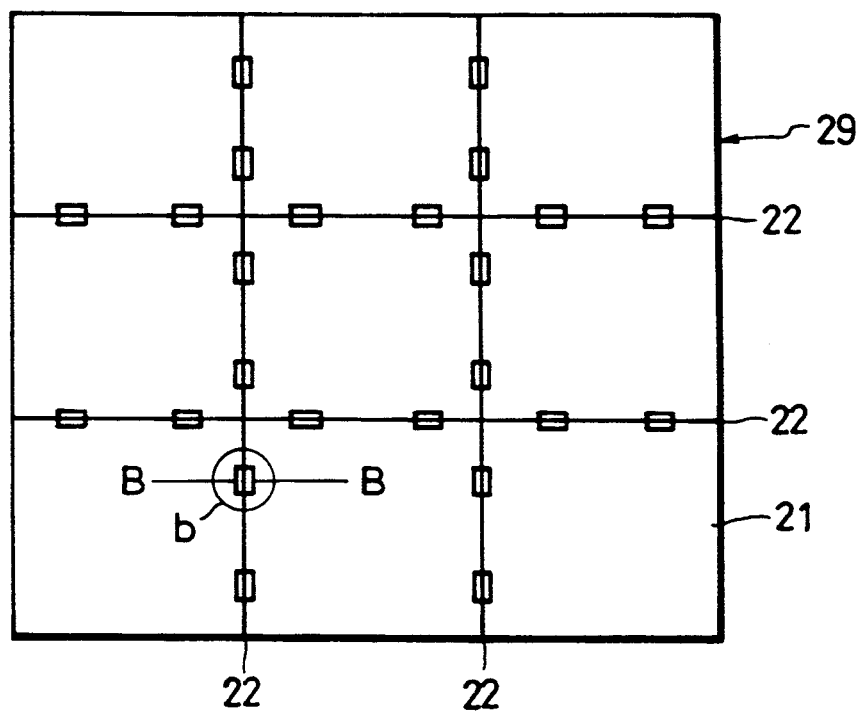
FIG. 4 (A) is a schematic illustration of a jointed panel which is other embodiment of the present invention, and FIG. 4 (B) is a sectional view taken at a line B—B, of the joint area of the jointed panel.
Figure 4:
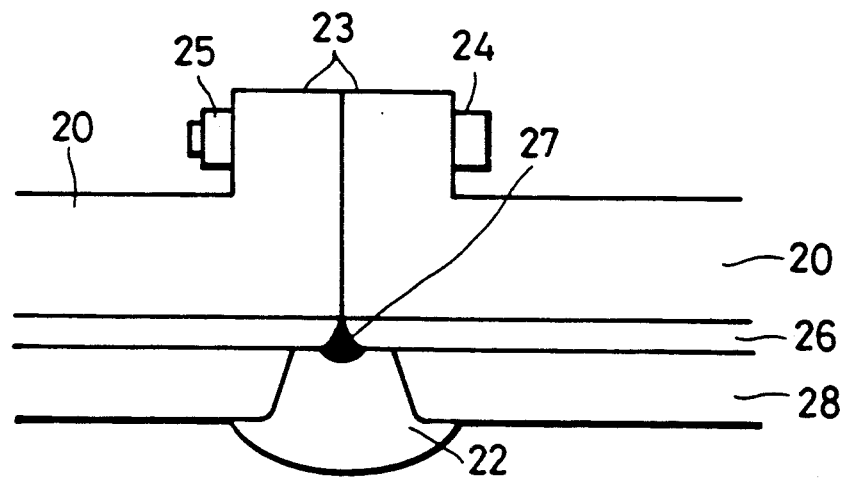

Then, as shown in FIG. 4(A), the nine flat sintered articles 21 were jointed at the edges to prepare a jointed panel 29.

FIG. 4(B) shows a sectional view taken at a B—B line, of the portion b of the joint areas 22 of the jointed panel 29. As shown in FIG. 4(B), each flat substrate 20 had projections 23 at the edges at the side opposite to the Ag-plated side; each two adjacent flat substrates 20 were jointed by fixing their projections 23 to each other at two points with bolts 24 and nuts 25. The plated Ag layers 26 were jointed at the joint areas 27 by TIG welding. The Bi-based superconducting layers 28 were jointed at the joint areas 22 by coating a slurry obtained by dissolving (a) the same $Bi_2Sr_2CaCu_2O_x$ powder as used for formation of the Bi-based superconducting layers 28 and (b) 1% by weight of PbO in isopropyl alcohol and then scanning a laser beam along each joint area to apply the beam only to each coated portion.

In this case, the laser beam energy and the scanning speed were controlled so that each joint area was melted partially. After the jointing, the laser energy was reduced to such a level that each joint area was not molten, and the scanning was continued in the same manner to effect a heat treatment to obtain a jointed panel 29 of about 1 m². The superconductor joint layer had a thickness of 500 μm.

The jointed panel 29 was evaluated for magnetic shieldability using a panel apparatus for measurement of magnetic shieldability, schematically illustrated in FIG. 5. In FIG. 5, the jointed panel 29 was placed in a container 34 for liquid nitrogen; the container 34 was filled with liquid nitrogen; an external magnetic field was applied to the jointed panel 29 by an electromagnet 35; using a Gauss meter 33 placed so that the container 34 was between the electromagnet 35 and the Gauss meter 33 and the Gauss meter was at the back of the jointed portion 36 which was the intersection of the joint areas 22 of the jointed panel 29, there was measured a maximum external magnetic field (this is the magnetic shieldability of the jointed panel 29) at which the magnetic field behind the jointed panel 29 began to exceed the background. As a result, the magnetic shieldability was 30 G. After this measurement, the joint areas of the joint panel 29 caused neither peeling nor cracking.

For comparison, the same flat sintered articles 21 having a Bi-based superconducting layer, as used above were jointed in the same manner as above except that the jointing of the Bi-based superconducting layers 28 were not effected. The jointed panel was measured for magnetic shieldability in the same manner. The magnetic shieldability was substantially zero.

As is clear from the above results, a Bi-based superconducting composition containing Pb and thereby having a reduced melting point has substantially the same superconducting properties as the Bi-based superconducting composition before Pb addition and posseses sufficient magnetic shieldability. It was also confirmed that, in partial melting of joint areas by electric furnace or laser beam, the Bi-based superconducting layers adjacent to the joint areas are not affected by the melting and accordingly not deteriorated.

EXAMPLE 5

There were mixed a $Y_2O_2$ powder (purity=99.9%, average particle diameter=0.4 μm), a $BaCO_3$ powder (average particle diameter=0.8 μm) and a CuO powder (average particle diameter=2.5 μm) at a molar ratio of 1:4:6. The mixture was calcinated at 940° C. for 10 hours in the atmosphere to synthesize a $YBaCu_3O_7$ powder.

2 kg of the $YBaCu_3O_7$ powder was mixed with 50 g of polyvinyl butyral (PVB) as a sintering agent and 5 g of a nonionic dispersant. The resulting mixture and 1 kg of zirconia grinding media were placed in nylon-made container containing 2 liters of toluene. The container was placed in a rotary mill to effect grinding and mixing for 16 hours to obtain a slurry. The slurry was subjected to spray drying to obtain a powder having an average particle diameter of 50 μm.

The powder was subjected to in-mold pressing by a hydrostatic pressure of 2.5 ton/cm² to prepare one cylindrical molded article (A) of 110 mm (outside diameter), 350 mm (height) and 8 mm (thickness) and three cylindrical molded articles (B) of 110 mm (outside diameter), 120 mm (height) and 8 mm (thickness).

All of these molded articles (A) and (B) were fired at 250° C. for 6 hours, 880° C. for 10 hours and 960° C. for 6 hours, and annealed at a rate of 1° C./min in an oxygen atmosphere obtain respective cylindrical sintered articles.

The Y-based superconductor cylindrical sintered article (A) had an outside diameter of 100 mm, a height of 300 mm and a thickness of 6 mm, and the Y-based superconductor cylindrical sintered articles (B) had an outside diameter of 100 mm, a height of 100 mm and a thickness of 6 mm.

Then, the end surfaces of the three Y-based superconductor cylindrical sintered articles (B) were smoothened by a SiC paper; the end surfaces to which are become a joint surface were coated with the same $YBaCu_3O_7$ slurry as above; the three articles were jointed, and subjected to firing and annealing in an oxygen atmosphere in the same manner as above to obtain a Y-based superconductor cylindrical sintered article (B') of 300 mm in height having joint areas. The Jc of the joint areas was 20 A/cm$^2$ and was lower than the Jc (100 A/cm$^2$) of the main part of the Y-based superconductor cylindrical sintered article (B').

Each of the superconductor sintered articles (A) and (B') was immersed in liquid nitrogen in a space of very low magnetic field ($10^{-4}$ G) magnetically shielded by permalloy, and placed in a superconducting state. Each superconductor sintered article was taken out into geomagnetism while being immersed in liquid nitrogen, and measured for magnetic intensity at the center of the cylindrical sintered article by a flux-gate type magnetic meter.

As a result, in both of the superconductor cylindrical sintered articles (A) and (B'), the magnetic intensity in the direction parallel to the cylindrical axis was $10^{-3}$ G or less, and geomagnetism was shielded completely.

COMPARATIVE EXAMPLE 1

In the same procedure as in Example 5 were prepared six semicylindrical molded articles (C) each having a shape obtained by dividing a cylinder of 110 mm (outside diameter), 120 mm (height) and 8 mm (thickness) into two equal parts in the axial direction, and the molded articles were fired to obtain six Y-based superconductor semicylindrical sintered articles (C). The superconductor sintered articles (C) were jointed in the same procedure as in Example 5 to obtain a Y-based superconductor cylindrical sintered article (C') of 300 mm in height having joint areas.

The superconductor cylindrical sintered article (C') was measured for magnetic shieldability in the same manner as in Example 5. As a result, the magnetic intensity in the direction parallel to the cylindrical axis of the superconductor sintered article (C') was $10^{-2}$ G, and it was confirmed that the part of geomagnetism came into the sintered article (C').

It was confirmed from Example 5 and Comparative Example 1 that in the oxide superconductor cylinder having joint areas in the axial direction, there is leakage of part of geomagnetism, while in the oxide superconductor cylinder of the present invention obtained by jointing divided cylindrical parts so that the joint areas exist in the direction crossing the cylindrical axis, there can be obtained about the same very low magnetic field as in a one-piece-molded cylinder made of the same oxide superconducting material and there is no leakage of magnetic flux from the joint areas.

What is claimed is:

1. A multisegmented jointed structure comprising a plurality of oxide superconductor segments and an oxide superconductor joint between adjacent segments, each oxide superconductor segment being an oxide superconducting composition having a melting point that is from 5° to 200° C. higher than the melting point of the oxide superconducting composition of an adjacent oxide superconductor joint.

2. A multisegmented structure according to claim 1, wherein each oxide superconductor segment comprises an Y—Ba—Cu—O superconducting material and each oxide superconductor joint comprises a Bi—Sr—Ca—Cu—O superconducting material.

3. A multisegmented structure according to claim 1, wherein each oxide superconductor segment comprises a Bi—Sr—Ca—Cu—O oxide superconducting material and each oxide superconductor joint comprises a composition obtained by incorporating a noble metal or Pb into a Bi—Sr—Ca—Cu—O oxide superconducting material.

4. A multisegmented jointed structure according to claim 3, wherein the Bi13 Sr—Ca—Cu—O oxide superconducting material is $Bi_2Sr_2CaCu_2O_x$.

5. A multisegmented jointed structure according to claim 3, wherein the noble metal is Au or Ag.

6. A multisegmented structure according to any one of claims 1, 2 and 3, wherein each oxide superconductor segment is a metal substrate having a layer of the oxide superconducting composition formed thereon.

7. A multisegmented structure according to any one of claims 1, 2 and 3, wherein each oxide superconductor segment and each oxide superconductor joint has a cylindrical shape.

8. A multisegmented structure according to claim 6, wherein each oxide superconductor segment and each oxide superconductor joint has a cylindrical shape.

9. A multisegmented structure according to claim 7, wherein each oxide superconductor segment has a length of 1/10 or more of the diameter of the cylinder.

10. A multisegmented structure according to claim 8, wherein each oxide superconductor segment has a length of 1/10 or more of the diameter of the cylinder.

11. A multisegmented structure according to claim 7, wherein each oxide superconductor joint is a hollow cylinder having a thickness of 2 mm or less.

12. A multisegmented structure according to claim 8, wherein each oxide superconductor joint is a hollow cylinder having a thickness of 2 mm or less.

13. A multisegmented jointed structure according to any one of claims 1, 2 and 3 wherein each oxide superconductor segment comprises an oxide superconducting composition having a melting point that is from 10° to 100° C. higher than the melting point of the oxide superconducting composition of an adjacent oxide superconductor joint.

* * * * *